(12) United States Patent
Bystrov et al.

(10) Patent No.: US 8,144,955 B2
(45) Date of Patent: Mar. 27, 2012

(54) AUTOMATED ROBUST LEARNING OF GEOMETRIES FOR MR-EXAMINATIONS

(75) Inventors: Daniel Bystrov, Hamburg (DE); Thomas Netsch, Eindhoven (NL); Stewart Young, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 767 days.

(21) Appl. No.: 12/279,992

(22) PCT Filed: Feb. 12, 2007

(86) PCT No.: PCT/IB2007/050452
§ 371 (c)(1),
(2), (4) Date: Aug. 20, 2008

(87) PCT Pub. No.: WO2007/096804
PCT Pub. Date: Aug. 30, 2007

(65) Prior Publication Data
US 2009/0067696 A1    Mar. 12, 2009

(30) Foreign Application Priority Data

Feb. 24, 2006   (EP) .................................. 06110369

(51) Int. Cl.
*G06K 900/200601* (2006.01)

(52) U.S. Cl. ....................................................... 382/128

(58) Field of Classification Search .................. 707/128, 707/728, 737; 382/128
See application file for complete search history.

(56) References Cited

U.S. PATENT DOCUMENTS

| | | | |
|---|---|---|---|
| 5,321,520 A * | 6/1994 | Inga et al. ...................... 358/403 |
| 6,195,409 B1 * | 2/2001 | Chang et al. .................... 378/20 |
| 2002/0156359 A1 | 10/2002 | Knoplioch et al. |
| 2003/0187358 A1 | 10/2003 | Okerlund et al. |
| 2005/0096530 A1 | 5/2005 | Daw et al. |
| 2005/0148852 A1 | 7/2005 | Tank |
| 2005/0259882 A1 * | 11/2005 | Dewaele ........................ 382/243 |
| 2006/0285755 A1 * | 12/2006 | Hager et al. ................... 382/224 |
| 2008/0201172 A1 * | 8/2008 | McNamar ........................ 705/3 |

FOREIGN PATENT DOCUMENTS

| | | |
|---|---|---|
| WO | 9724697 A1 | 7/1997 |
| WO | 02091924 A1 | 11/2002 |

(Continued)

OTHER PUBLICATIONS

Koen "Automated Segmentation of Multiple Sclerosis Lesions by Model Outlier Detection" IEEE Transactions on Medical Imaging 2001.*

(Continued)

*Primary Examiner* — Robert Timblin
*Assistant Examiner* — Masoud S Hakami (57) ABSTRACT

A function generator (MFG) formulates a query to a mapping database (DBM) based on a received planning geometry type (PGT) and receives corresponding function data (MFD) which is processed to create a function (MF). An evaluator (ELV) receives the function (MF) and an anatomical landmark set (LMS) and determines a computed planning geometry (CPG). A user interface (UI) displays a survey image (IMG), the landmark set (LMS), and the computer planning geometry (CPG) and allows the user to adjust the landmark set and/or the computer program geometry. A record generator (RG) creates a new record from the user adjusted landmarks (ULMS) and the user adjusted computer planning geometries (UPG) and loads the new records (NR) into the mapping database (DBM).

15 Claims, 4 Drawing Sheets

FOREIGN PATENT DOCUMENTS

WO 2006013499 A1 2/2006

OTHER PUBLICATIONS

Outlier Detection Irad Ben-Gal Department of Industrial Engineering Tel-Aviv University Ramat-Aviv, Tel-Aviv 69978, Israel. 2005.*

Automated Segmentation of Multiple Sclerosis Lesions by Model Outlier Detection Koen Van Leemput, Frederik Maes, Dirk Vandermeulen, Alan Colchester, and Paul Suetens Aug. 2001.*

* cited by examiner

AUTOMATED ROBUST LEARNING OF GEOMETRIES FOR MR-EXAMINATIONS

The invention relates to a software product for planning scan-geometries in a magnetic resonance system.

The invention further relates to a magnetic resonance system provided with such a geometry planning software product.

Manually planning patient specific geometries at MR-scanner consoles is error-prone, needs a lot of training, and in some applications it can also be time-consuming (e.g. cardiac). The ease-of-use and the throughput of MR-scanners can be improved by automatically recognizing anatomical structures in survey scans, and then in a second step deriving planning geometries from theses structures. An example of a geometry may be a coordinate system that is positioned and oriented in dependency from the recognized anatomical structures. For anatomical structures such as the spine, a curvilinear coordinate system may be contemplated. Another example of a geometry is a box defining the volume of interest (VOI).

In U.S. Pat. No. 7,903,854, a database of user corrections to automatically planned geometries is proposed, which can be used to adapt the planning procedure to the user corrections of previous examinations. For this purpose, the object shown in a survey scan, such as a body organ, is classified in one of a plurality of anatomical classes. This classification is achieved by evaluating shape parameters of the object. For example, the heart may fall in a class "H", which has subclasses "A", "B", and "C" that indicate whether the heart is elongated or compact. These shape parameters serve to retrieve default parameters of the imaging geometry. Furthermore, the shape parameters also serve to retrieve user adjustments that were carried out on previous imaging geometries of the same anatomical class or adjacent anatomical classes. A linear weighting of all user adjustments in dependence on the corresponding anatomical classes is mentioned.

Figure 1:
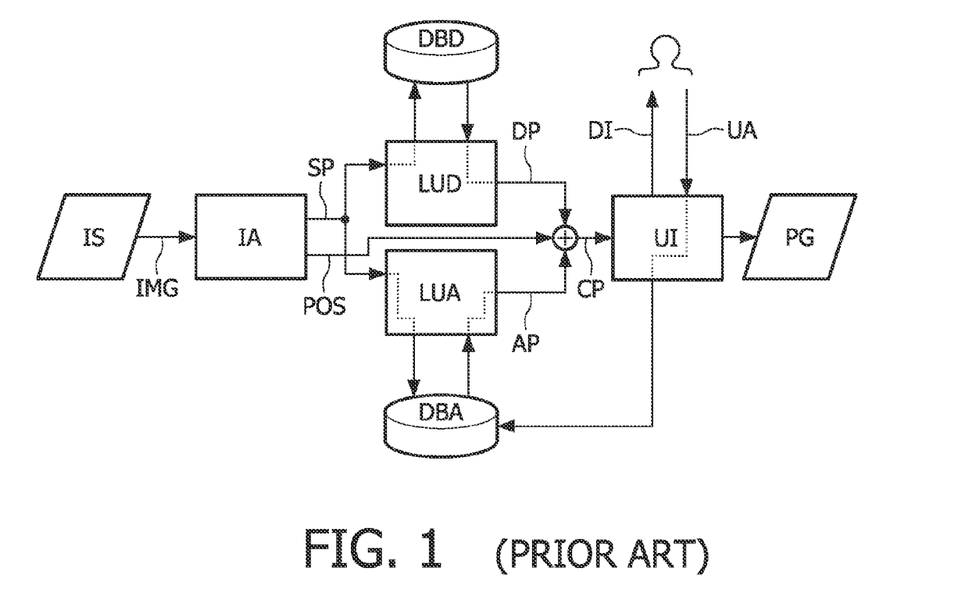
FIG. 1 presents a data flow diagram of a geometry planning system according to the prior art.

FIG. 1 shows a diagram of the mentioned geometry planning system according to the prior art.

In FIG. 1, a survey image is supplied by Image Source IS. The IMaGe IMG is passed to an Image Analysis IA, in which Shape Parameters SP are determined that describe the part of the body of a patient depicted in the survey image sufficiently exact to serve for a classification of the body part. The image analysis also determines POSition POS of the body part. The shape parameters are sent to a component for Look-Up of Default parameters LUD that queries a DataBase of Default parameters DBD with the determined shape parameters SP. This query of the database of default parameters DBD yields one or more Default Parameters DP. The shape parameters SP are also passed to a component for Look-Up of user Adjustments LUA. This component queries a DataBase of user Adjustments DBA, which yields one or more Adjustment Parameters AP. The look-up of user adjustments component also performs a linear weighting that is based on the anatomical classes of the organ shown in the survey image and of the user adjustments stored in the database of user adjustments LUA. The results of the two database queries DP, AP are combined. The position POS is also considered in this combination, which is represented by an addition. The results of this addition are the Computed Parameters CP which are passed to a User Interface UI. At the user interface UI the planning geometry determined by the computer on the basis of the default planning geometry parameters DP and previous user adjustments parameters AP are shown as a Displayed Image DI to the user, such as a radiologist or a surgeon. Depending on whether the user is satisfied with the currently displayed image or not, he may make further User Adjustments UA to the displayed image. These user adjustments UA are considered by the user interface UI. The user interface passes the user adjustments UA to the final Planning Geometry PG that will be used for the following actual image acquisition process. Furthermore, the user adjustments are also passed to the database of user adjustments DBA where they are stored for later sessions.

An insight of the present invention is that what is needed is a geometry planning system enabling important new features. One of these features is the learning of relevance of different landmarks for a specific planning geometry from user input. Another feature is automated outlier detection, which is indispensable for the robustness of automated planning in the clinical routine.

In the planning process, a number of anatomical landmarks are computed using image processing algorithms, but a specific planning geometry might only depend on a few of them: For example, short axis views for cardiac examinations depend only on the positions of the valves and the apex. This dependency can be "learned" by a dedicated algorithm which approximates the mapping from cardiac/thoracic short-axis views using several data samples for this mapping. For this purpose, the detected anatomical landmarks as well as the resulting geometries should be stored in a database as training set.

In the clinical routine, failures and inconsistencies in the training set (the database) may occur. Therefore the planning algorithm should be robust with respect to such outliers in the database. If the planning database is organised as described by this invention, the negative influence of outliers can be suppressed and consistency tests for the database can be performed.

The present invention proposes an according geometry planning software product and procedure.

A geometry planning software product for magnetic resonance system according to the invention, comprises a database manager arranged to process an anatomical landmark set and a planning geometry of a current geometry planning session by forming a combination of both, and to add said combination to a database.

Planning a geometry may be considered as mapping data from a landmark domain to data in a planning geometry domain. To this end, an appropriate function is used. Each combination (or "sample") comprises data of the landmark domain in the form of an anatomical landmark set and data from the planning geometry domain in the form of a retained planning geometry. Anatomical landmarks indicate points in a survey image that represent a particular anatomical structure, such as the cardiac apex or one of the cardiac valves. The landmark may be one-dimensional, two-dimensional, three-dimensional, or of another dimensionality. A landmark set is a group of usually different landmarks that are used in the determination of a corresponding planning geometry. The planning geometry aggregates all parameters required for setting up an imaging system for the high resolution acquisition and possibly intermediate parameters. Using this data, a function that is valid for this sample can be found. A requirement for the function is that it presents sufficient degrees of freedom if each data item is to be handled in an exact manner by the function. In most cases however, an approximation of the function is sufficient so that the function may have a simpler structure.

An advantage of the present invention is that the database collects data about the geometry planning process with every geometry planning session. By storing a combination of both, the anatomical landmark set and the planning geometry, the database contains the information needed to reproduce the current geometry planning session at a later instant.

In an embodiment of the present invention, the database manager is further arranged to handle a plurality of said combinations, and the geometry planning software product further comprises an approximator arranged to generate, by using a subset of said combinations of prior geometry planning sessions having session parameters similar to those of a current planning geometry session, a function that maps a current landmark set to a current planning geometry.

Preferably, the combinations are retained from previous geometry planning sessions. The combinations may also include samples serving as a default setting provided by the manufacturer. After some time of utilisation of the geometry planning software, the number of combinations stored in the storage increases. This gives raise to the possibility of evaluating an increased number of combinations in which data corresponding to previous geometry planning sessions are stored. Since the magnetic resonance system may be used for different acquisition types, the samples may be referred to by the corresponding acquisition type. Examples of acquisition types may be for example cardiac short-axis view, cardiac 4-chamber view, or views of other organs. Combinations that refer to the same acquisition type or a similar acquisition type may form a subset so that these combinations are used for determining the function. It should be noted that in a special case, the geometry planning software may be used for only one acquisition type. In this special case, the subset may comprise all combinations.

An advantage of the geometry planning software is that it is flexible. Another advantage is that it adapts to special user needs and preferences.

An advantage of a database manager is that it takes care of the communication with the database. The manager may for example send queries to the database, receive answers from the database, and populate the database with new data. These functions and other functions in relation with data storage, and storage of the combinations in particular, may also be distributed to subcomponents.

One of the essential features of the invention is the persistent storage of anatomical landmarks in combination with planning geometries, which have been manually adjusted. If multiple geometries are derived from the same landmark set (e.g. short-axis and 4-chamber view of the same patient in the same session), the different planning geometries can be stored in different databases or using different identifying keys for these geometries. Before a new plan can be derived for a patient, a set of anatomical landmarks for this patient is computed using e.g. survey scans and a dedicated image processing technique. Then all geometries (with the same identifying key) for a given plan in the database are used to approximate a mapping from landmarks to geometries:

anatomical landmarks→planning geometries.

In order to derive a plan for a current patient, the function above is evaluated using the values of the computed anatomical landmarks of the current patient.

In an embodiment of the present invention, the geometry planning software product may further comprise an evaluator arranged to evaluate the relevance of an anatomical landmarks for a given geometry.

A landmark defines e.g. the position of an anatomical structure of interest. For example, a particular planning geometry for imaging a short-axis view for cardiac examinations may depend only on the positions of the valves and the apex. The landmark set used for this planning geometry definition contains for example data fields for each of the needed landmarks. When the landmark set is to be used to determine a corresponding planning geometry, these data fields need to be filled with actual values which are taken from the current survey image. However, some anatomical landmarks have much influence on the resulting planning geometry, while others have little or virtually no influence on the resulting planning geometry. Although in theory this could have been taken care of right from the beginning, a radiologist or a scientist experimenting with new acquisition techniques may not be aware of which landmarks are relevant, when beginning his studies. Only after a number of similar examinations e.g. of different patients, it may become clear. Furthermore, it may be found that certain landmarks almost always present to some extent a dependency, such as a linear dependency from each other. These dependencies may be hard to detect by a human user.

An advantage of the evaluator is that it is arranged to evaluate the combinations available in the storage. The evaluation is directed to the landmarks. For each landmark, the corresponding data from each landmark set is retrieved.

The planning geometry software product may further comprise an outlier detector arranged to be applied on combinations contained in said database, and to detect combinations that yield a function differing significantly from an average function within corresponding subset of combinations having similar session parameters.

Since the stored combinations were generated during previous planning geometry sessions, they were determined either automatically by an appropriate algorithm or entered manually by the user. In the case of automatically determined planning geometries, these may have been adjusted or corrected by a user. In any event, the action of determining a planning geometry and also the preceding action of determining the landmarks cannot be expected to be completely error free. This is caused for example by the quality of the survey image and also by user preferences. This causes a certain number of the combinations stored in the storage to be erroneous. These combinations should not be considered or at least less weighted for subsequent function approximations. However, they first need to be identified. The outlier detector performs this task. It should be noted that the stored landmark sets and the planning geometries themselves may show a large variety even for similar types of acquisition. This variety depends on e.g. the position of the patient. However, the function that links a particular landmark set to a particular planning geometry should not vary too much between two combinations of the same acquisition type. If it does, it may be an indicator for erroneous data in one or both of the two combinations. The function may be defined by a collection of numerical and/or Boolean coefficients. Other representations of the function are also possible. These coefficients may be retrieved for all combinations of the chosen acquisition type and then statistically analysed, for example. The statistical analysis yields a couple of properties, such as the mean value of each of the coefficients over the retrieved combinations. It may also yield a standard deviation for a coefficient. A function of a particular combinations may be identified as differing significantly, if one or a certain number of its coefficients are at a distance from their respective mean values that exceeds a predefined threshold, such as $k*\Sigma(sigma)$, where k may be chosen for example between 0 and 3.

If the criteria for identifying a function that differs significantly from the average are fulfilled, then the corresponding combination may be marked accordingly, which causes the approximator to consider this combination to a lesser extent. The combination may also be deleted. The deletion may be performed automatically or after having consulted the user. User consultation may also be required if two or more clusters of functions begin to appear. This may indicate that actually two or more different acquisition types are mixed up, which should be separated.

In a further embodiment of the invention, the manager is arranged to support a confidence value for each of the combinations.

The confidence value of the combination provides a more gradual handling of possibly erroneous samples. If the confidence falls below a certain value, the corresponding combination will be deemed to be deleted. This may be particularly of advantage if only a small number of combinations are available. This is the case when the planning geometry system was taken into service only recently.

The approximator may be arranged to determine a function in a robust manner with respect to outlying combinations.

Outlying combinations primarily occur for two reasons. The first reason is a false detection of landmarks. Although the user may be given the opportunity to correct those misplaced landmarks, some errors may still remain. Other reasons are inconsistent planning geometries that were input by users. A robust behaviour may be achieved by employing e.g. a robust median instead of a non-robust means.

The manager may further be arranged to support an indicator of a corresponding function type for each of the combinations.

An advantage of a function type indicator is that it facilitates the grouping of combinations resulting from similar acquisition tasks. The indicator may comprise a field for a landmark set type and a field for a planning geometry type.

The function approximator may be further arranged to perform a regression analysis on the combinations.

An advantage of performing a regression analysis is that the function may have a relatively simple structure. The regression analysis computes an optimal function typically by minimising the sum of the normalised errors of the combinations from this optimal function. A widely known method is to minimize the sum of the squared errors or the combinations. The function may be multi-dimensional, i.e. it maps a multi-dimensional landmark set domain to a multi-dimensional planning geometry domain.

The planning geometry software product may be provided as an upgrade or update for an installed software product.

An advantage of providing the software product as an upgrade or update for an installed software product is that existing magnetic resonance systems may also benefit from the present invention. The software product according to the present invention may replace a pure user interaction system for planning geometry determination.

It is a further object of the invention to provide a magnetic resonance system provided with a planning geometry software product as described above.

An advantage of a magnetic resonance system provided with the described planning geometry software product is that the ease-of-use and the throughput of the magnetic resonance system can be improved, since geometry determination can be performed faster. Furthermore, the geometry determination process becomes more consistent so that the conditions of the subsequent high resolution acquisition are more constant, which aids the user in interpreting them.

According to another preferred embodiment of the present invention, a data structure for use in a database of a magnetic resonance geometry planning system is proposed. The data structure comprises a first substructure representing an anatomical landmark set, and a second substructure representing a corresponding planning geometry.

An advantage of the proposed data structure is that the information relating to a geometry planning session is stored within an entity. The data structure may be defined by means of a programming language or e.g. as a database record.

According to another preferred embodiment of the present invention, a method for geometry planning for a magnetic resonance system is proposed. The method comprises the steps of:
during a current geometry planning session, retrieving a current landmark set and a current planning geometry,
combining said current landmark set and said current planning geometry to form a corresponding combination, and
storing said combination in a database.

This method may be implemented as a computer software product. For advantages of the method reference is made to the corresponding computer software product section above.

These and other aspects of the invention will be described in further details with reference to the figures.

FIG. 1 presents a data flow diagram of a geometry planning system according to the prior art and is described in the introduction of this application.

Figure 2:
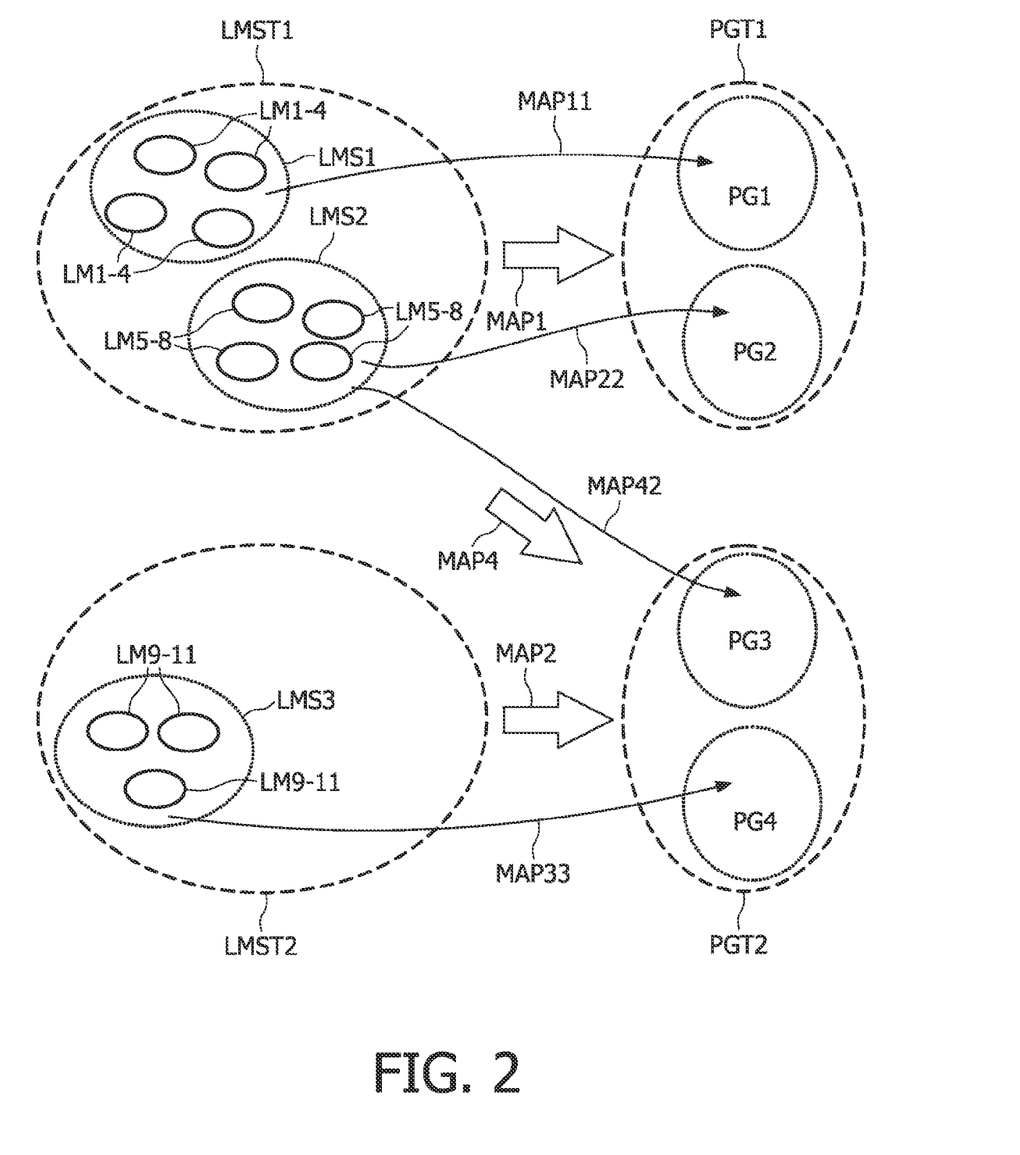
FIG. 2 presents a schematic representation of functions and their associated variables.

FIG. 2 presents a schematic representation of functions and their associated variables. On the left side of FIG. 2, a landmark domain set domain is represented. The landmark set domain is subdivided in two landmark set types. Two landmark set types LMST1, LMST2 are represented by dashed ellipses. The landmark set type defines which landmarks are contained within a landmark set and for which purpose the landmark set is used. The first landmark set type LMST1 comprises two landmark sets LMS1 and LMS2 represented by dotted ellipses. The actual landmarks, represented by full lines, are contained in the landmark sets. As can be seen in FIG. 2, landmark set LMS1 comprises four landmarks LM1-4, which is to be read as LM1, LM2, LM3, and LM4. Landmark set LMS2 also comprises four landmarks LM5-8. Beneath landmark set type LMST1 is represented another landmark set type LMST2. Landmark set type LMST2 shows only one landmark set LMS3 that in turn comprises three landmarks LM9-11.

On the right side of FIG. 2 is represented the planning geometry domain. Two planning geometry types PGT1 and PGT2 are shown as dashed ellipses. Each planning geometry type comprises a number of actual planning geometries, represented as dotted ellipses. Planning geometries PG1 and PG2 belong to planning geometry type PGT1. Planning geometries PG3 and PG4 belong to planning geometry type PGT2.

It is assumed that a particular landmark set type can be mapped to a particular planning geometry type. It is also assumed that a unique mapping exists. In FIG. 2, three cases are depicted as bloc arrows. Bloc arrow MAP1 represents the assumed mapping from landmark set type LMST1 to planning geometry type PG1. Bloc arrow MAP2 represents the assumed mapping from landmark set type LMST2 to planning geometry type PG2. Bloc arrow MAP3 represents the assumed mapping from landmark set type LMST1 to planning geometry type PG2. In reality, the unique mapping cannot be easily determined. However, between a given landmark set and a given planning geometry an actual realisation of the mapping can be observed. These actual realisations are represented in FIG. 2 as thin arrows MAP11, MAP22, MAP33, and MAP42. The first digit designates the planning geometry, while the second digit designates the landmark set. The actual realisation of the mapping can be employed to estimate the theoretical mapping. To give an example, actual realisations MAP11 and MAP22 could be used to estimate theoretical mapping MAP1.

The mapping MAP42 from landmark set LMS2 to planning geometry PG3 is somewhat special in that it provides a second mapping that originates in landmark set LMS2. In fact, one survey image may be acquired for several acquisitions. One landmark set may also be used to determine two or more planning geometries. Some landmarks required for determining the first planning geometry may not be required for determining the second planning geometry, and vice versa. Accordingly, the corresponding two functions are not required to consider those landmarks that are irrelevant for the corresponding planning geometry. This is made possible by one of the aspects of the present invention.

Figure 3:
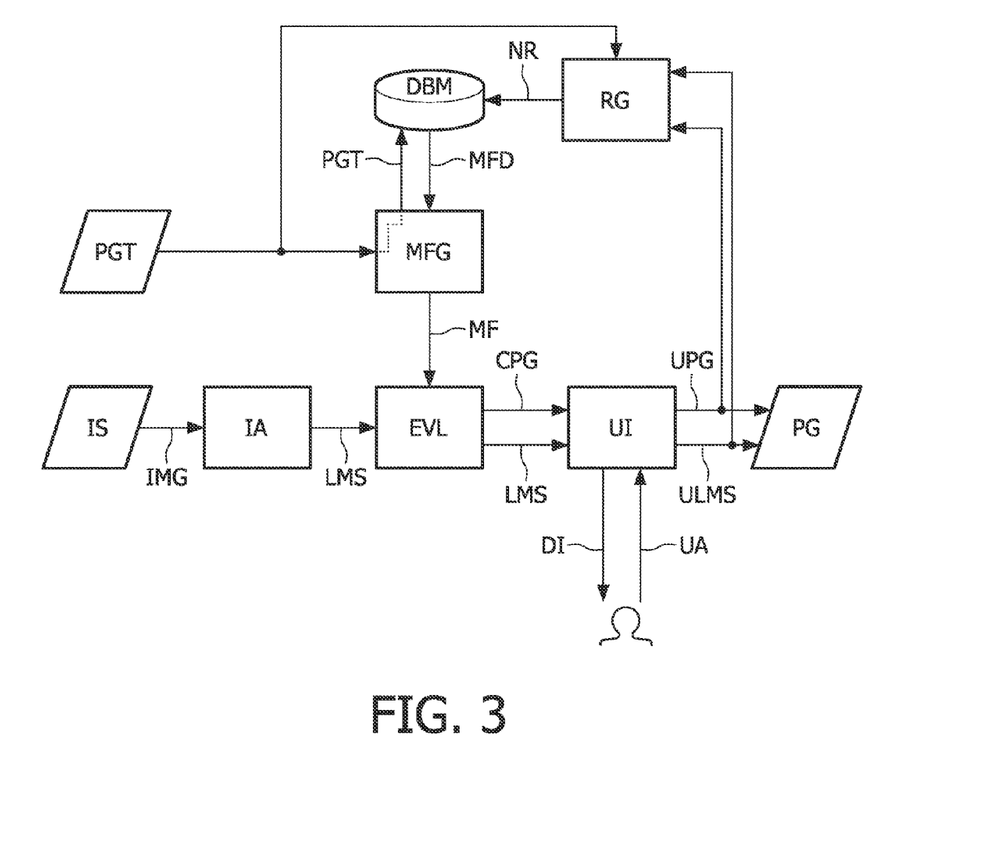
FIG. 3 presents a data flow diagram of a geometry planning system according to an embodiment of the present invention.

FIG. 3 presents a data flow diagram of a planning geometry system according to an embodiment of the present invention. A survey image is provided by an Image Source IS. It is processed by an Image Analysis IA that generates a landmark set LMS. This may be achieved by automatic feature detection in the survey image. Furthermore, Planning Geometry Type PGT is provided for example by an appropriate input of user who indicates what kind of acquisition he wishes to perform. The planning geometry type PGT is passed to a Function Generator FG which formulates a query to a DataBase of Mappings DBM based on the planning geometry type selected by the user. The database of mappings returns a corresponding Function Data FD. The function generator FG processes the function data FD to create a Function F. The function is passed to an EVaLuator of the function EVL. The above mentioned landmark set is used as an input for the function F created by the function generator FG. The evaluator of the function EVL determines a Computed Planning Geometry CPG. Together with the landmark set LMS the computed planning geometry CPG is passed to a User Interface UI. The user interface UI displays a Displayed Image DI to the user. The displayed image DI may contain the landmarks, the planning geometry, and the survey image so that the user may check the correctness of planning geometry. If the user detects errors, which may occur in the computed planning geometry CPG or the landmark set LMS, he may correct these errors interactively by entering User Adjustments UA. If the error was in the landmark set, it may be contemplated to return the data to the evaluator of the function for determining a new computed planning geometry CPG based on corrected values. If the user is satisfied with the result, he accepts the computed planning geometry CPG by entering an appropriate user input. The User adjusted Planning Geometry UPG (wherein the term user adjusted also comprises the acceptance of the user without actually changing the data) is transmitted to the final planning geometry, where it is now available for setting up the magnetic resonance system for the high resolution acquisition. In combination with the User adjusted LandMark Set ULMS the user adjusted planning geometry UPG is also transmitted to Record Generator RG. The record generator produces a New Record NR to be stored in the database of mappings DBM. From this moment on, it is available for future generations of functions F performed by the function generator.

An embodiment of the present invention may also be described in the following way.

In a first step, image processing algorithms for identifying anatomical structures are required. For example, a model could be matched in the images (survey images or scout images). Then, a set of anatomical landmarks can be identified.

If there are no previous plans for the required plan in the database available, a default geometry can be computed (dependent on anatomy) or the geometry can be determined manually.

Otherwise, if there are already plans of the required type available in the database, these samples are used to approximate a mapping F from anatomical landmarks to planning geometries.

The function F is evaluated for the landmarks computed in the first step. The result of this evaluation is a plan (or geometry) of the required type.

The derived plan is shown to the user at the MR-scanner console. Possibly the user adjusts this automatically derived plan. In both cases the user can give a feedback to the system by indicating that the retained sample of landmarks and planning geometry has been checked by the user.

After a while, outliers resulting from misplaced landmarks or from inconsistent input of the user can occur in such a planning database. These kind of outliers can be detected by applying the database content to itself (leaving out some samples) or the negative influence of these outliers can be suppressed using robust approximation techniques for constructing the function F (e.g. robust median computation instead of non-robust means).

Furthermore, the manually adapted plans in combination with the anatomical structures can be used to find out the relevance of different landmarks for a given planning task (using e.g. a regression based learning algorithm).

Figure 4:
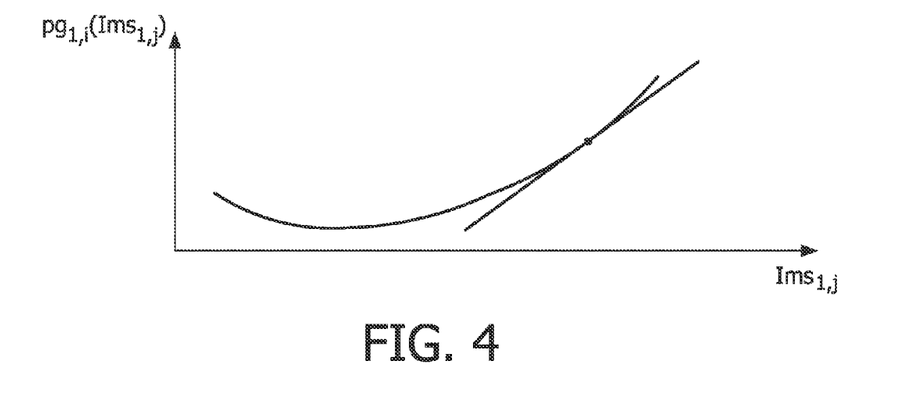
FIG. 4 presents a diagram showing a partial derivative of the function.

FIG. 4 presents a diagram showing a partial derivative of the function. The function may be represented by a mapping of m-dimensional landmark set domain to n-dimensional planning geometry domain:

$$PG=(pg_1,pg_2,pg_3,\ldots pg_n)^T=F((lms_1,lms_2,lms_3,\ldots lms_m)^T)=F(LMS)$$

where PG is the planning geometry, $pg_i$ is the i-th component of PG, F is the function, LMS is the landmark set, and $lms_j$ is the j-th component of LMS. Typically, landmarks are two-dimensional or three-dimensional. Each coordinate of a landmark may constitute a component of LMS.

The Jacobian matrix of F can be determined as:

$$J(PG) = \begin{pmatrix} \frac{\partial pg_1}{\partial lms_1} & \cdots & \frac{\partial pg_1}{\partial lms_m} \\ \vdots & \ddots & \vdots \\ \frac{\partial pg_n}{\partial lms_1} & \cdots & \frac{\partial pg_n}{\partial lms_m} \end{pmatrix}$$

Therefore, the Jacobian matrix contains the derivatives of the components $pg_i$ of the planning geometry PG with respect to the components $lms_j$ of the landmark set LMS.

If a certain derivative $$\frac{\partial pg_i}{\partial lms_j}$$

is close to zero, then this can be interpreted by $pg_i$ being hardly dependent from $lms_j$. In the opposite case, this derivative is relatively strong which can be interpreted as a strong dependency of $pg_i$ from $lms_j$. FIG. 4 shows a diagram of $pg_{1,i}$ as a function of $lms_{1,j}$ for the latter case. The variables $pg_{1,i}$ and $lms_{1,j}$ both belong to a first acquisition type, which is designated by their first index. At an arbitrary point of the function, the tangent is represented which is relatively steep. In the vicinity of the considered point, $pg_{1,i}$ presents a strong dependency from $lms_{1,j}$. Since the function $pg_{1,i}(lms_{1,j})$ is not a constant, it should be evaluated while determining the planning geometry using the current value of $lms_{1,j}$.

Figure 5:
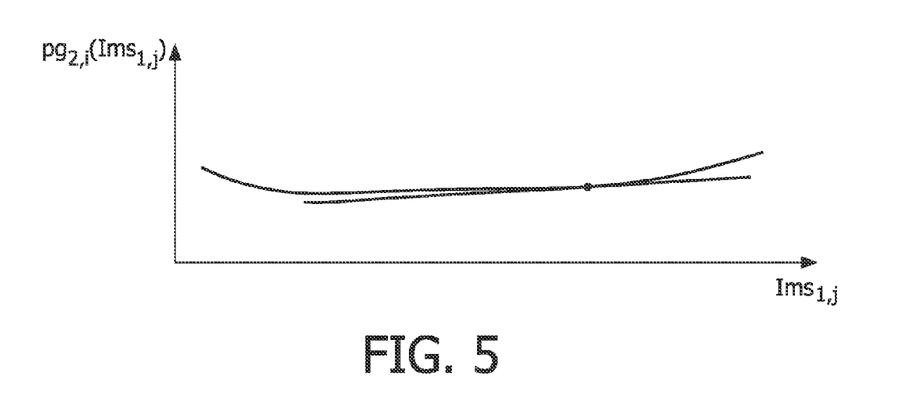
FIG. 5 presents a diagram showing another partial derivative of the function.

FIG. 5 presents a diagram showing another partial derivative of the function. The underlying considerations are the same as for FIG. 4. In this case however, for another acquisition type the component $pg_{2,i}$ does not present a very strong dependency from $lms_{2,j}$ since it is nearly constant over a large range. The tangent drawn at an arbitrary point is almost horizontal and indicates that the derivative at this point is close to zero. For the implementation of the present invention, this may lead to the insight that this particular component of the function is not very relevant for the resulting planning geometry. However, up to now the impact of $lms_{2,j}$ on only one component of the resulting planning geometry has been considered. It may be that $lms_{2,j}$ has in influence on e.g. $pg_{2,i+1}$. Furthermore, it has to be taken into account that, as mentioned above, a landmark may be two-dimensional or three-dimensional. In summary, a landmark may be marked as irrelevant for a given planning geometry type, if none of the landmark's components have a strong influence on any of the planning geometry's components. To this end, preferably a suitable norm is employed.

An alternative technique for determining the relevance of a certain anatomical landmark is to observe the frequency of user adjustments for each of the landmarks. If the user often adjusts a particular landmark, then the user indicates that he considers this landmark to be relevant. The frequency of user interaction could therefore be converted to a relevancy weighting factor that could be stored with the sample in the storage.

Figure 6:
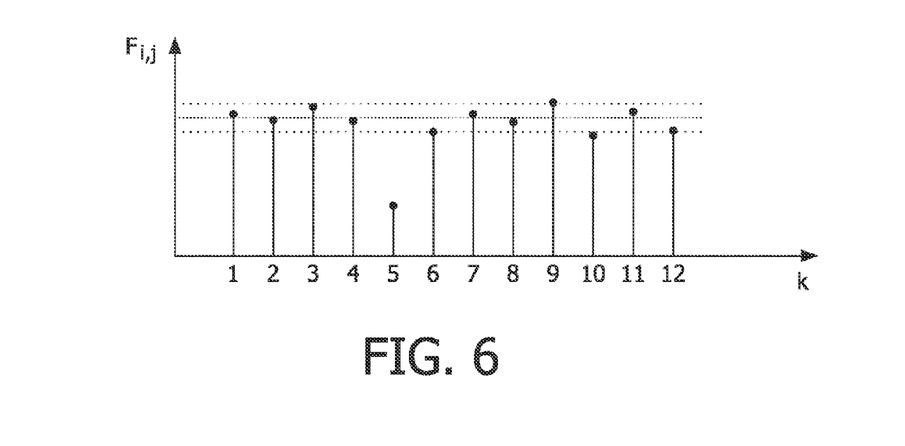
FIG. 6 shows a particular coefficient of the function over a number of mapping combinations.

FIG. 6 shows a particular coefficient of the function over a number of combinations. The particular coefficient is $F_{i,j}$, which maps input j (landmark domain) to output i (planning geometry domain). For ease of explanation, it is assumed that the function F defines a linear dependency between input j and output i. Accordingly, coefficient $F_{i,j}$ is a constant factor. The index k enumerates the samples. As can be seen in FIG. 6, twelve samples were gathered. In order to detect outliers, the mean of the coefficient $F_{i,j}$ may be calculated which is represented as a horizontal, closely dotted line in FIG. 6 in a figurative way only. Furthermore, the mean value may be surrounded by a tolerance domain, such a the σ-interval (sigma interval). This interval is represented by two horizontal, widely dotted lines in FIG. 6. It may be seen that most of the samples provide a value for coefficient $F_{i,j}$ that is within the tolerance interval of the mean value. On the other hand, sample no. 5 differs significantly from the mean value. This sample no. 5 may be marked for deletion since it is a cause for erroneous function approximation in the future. The user may be warned about the deletion so that he may confirm the deletion after having reviewed the sample. Also sample no. 10 needs special attention. Although only slightly off the tolerance interval, it may be considered that sample no. 10 is also marked in a special manner. For example, sample no. 10 may be kept in the database for the time being in order to observer how the mean value develops over the next couple of samples that are acquired and retained by the user. While it is outside the tolerance interval, it may be suspended i.e. it is not considered during the actual approximation process, or only with a small weighting factor. If after a certain number of additional samples it is still found that sample no. 10 is outside the tolerance interval, it may be marked for final deletion. To this end a counter or time stamp could be provided with the sample that allows determining how old the sample is and when it was marked as suspended.

The invention has been described with reference to the preferred embodiments.

Obviously, modifications and alterations will occur to others upon reading and understanding the preceding detailed description. It should be noted that in spite of the fact that the above invention was described with respect to magnetic resonance images, the present invention may also be applied to computer tomograph images (CT), positron emitted tomography images (PET), single photon emission computed tomography images (SPECT) or ultrasound modalities (US). The invention could also be applied to systematic processing or post-processing of medical databases these imaging modalities.

The invention claimed is:

1. A geometry planning system for a magnetic resonance imager, comprising:
   a memory device that stores a mapping database;
   an image analyzer that analyzes a survey image from an image source to generate a set of anatomical landmarks;
   a planning geometry type module which receives an input of a type of image acquisition to be performed and generates planning geometry type indicator;
   a function generator which:
      formulates a query to the mapping database based on the planned geometry type indicator from the planning geometry type module,
      receives corresponding function data from the mapping database, and
      processes the received function data to create a function;
   an evaluator arranged to evaluate a relevance of anatomical landmarks of the set of image landmarks generated by the image analyzer for a geometry indicated by the function created by the function generator to determine a computed planning geometry;
   a user interface device receives the anatomical landmark set and the computed planning geometry, and the survey image, and displays on a display device the landmarks, and the computed planning geometry, the user interface device further receiving any user adjustments to the anatomical landmark set or the computed planning geometry and returns landmark adjustments to the evaluator to reevaluate the computed planning geometry, and the user interface device further receiving a user acceptance of the anatomical landmark set and the computed planning geometry;
   a final planning geometry module which receives the user accepted computed planning geometry for use in setting up the magnetic resonance imager for generating a high resolution scan;
   a record generator which receives the user accepted landmarks and the user accepted computed planning geometry from the user interface device, generates a new record therefrom, and loads the new record in the mapping database for use by the function generator in creating future functions.

2. The geometry planning system according to claim 1, further including:
   an outlier detector which detects combinations stored in the mapping database that yield a function differing significantly from an average function within a corresponding subset of combinations having similar session parameters.

3. The geometry planning system according to claim 2, wherein said outlier detector determines a confidence value for each of said combinations.

4. The geometry planning system according to claim 3, wherein said function generator is arranged to determine the function in a robust manner with respect to outlying combinations.

5. The geometry planning system according to claim 1, wherein said function generator performs a regression analysis on combinations of anatomical landmark sets and computed planning geometries.

6. The geometry planning system according to claim 1, wherein the function maps between landmarks and planning geometries.

7. A magnetic resonance system comprising:
a magnetic resonance imager which generates survey images and high resolution scan images; and
a geometry planning software according to claim 1.

8. A geometry planning method for a diagnostic imaging system, comprising:
formulating a query to a mapping database based on a received planned geometry type;
receiving from the mapping database function data corresponding to the query;
processing the received function data to create a function;
evaluating a relevance of anatomical landmarks of a set of received anatomical landmarks to a planning geometry indicated by the function to determine a computed planning geometry;
on a user interface, displaying a survey image, the received set of anatomical landmarks, and the computed planning geometry for user adjustment;
in response to receiving any user adjustments to one or more of the landmarks, regenerating the computed planning geometry based on the one or more user adjusted landmarks to generate an adjusted computed planning geometry;
in response to receiving user adjustments to the computed planning geometry, generating the adjusted computed planning geometry;
generating a new record from the adjusted computed planning geometry and unadjusted or the adjusted landmarks;
loading the new record into the mapping database for use in creating future function data.

9. The method according to claim 8, further including:
generating a survey image with a diagnostic imaging system;
analyzing the survey image to generate the set of anatomical landmarks.

10. The method according to claim 9, further including:
generating a high resolution diagnostic scan with the diagnostic scanner using the adjusted computed planning geometry.

11. A diagnostic imaging system comprising:
a diagnostic imager;
a user interface;
one or more processors programmed to perform the method according to claim 10.

12. A magnetic resonance imaging system comprising:
a magnetic resonance imaging system;
a user interface;
one or more processors programmed to perform the method according to claim 10.

13. The method according to claim 8, further including:
analyzing the records stored in the mapping database to identify function data which differ significantly from average function data within a corresponding subset of combinations having similar computed planning geometries.

14. The method according to claim 8, further including:
analyzing the records stored in the mapping database to determine deviations from an average;
determining a confidence value for the function data in accordance with the determined deviations.

15. A non-transitory computer-readable medium carrying software for controlling one or more processors to perform the method according to claim 8.

* * * * *